US006608503B2

(12) United States Patent
Shenai et al.

(10) Patent No.: US 6,608,503 B2
(45) Date of Patent: Aug. 19, 2003

(54) HYBRID COMPARATOR AND METHOD

(75) Inventors: Krishna Shenai, Naperville, IL (US);
Erik A. McShane, Lockport, IL (US);
Manigandan Radhakrishnan, Chicago, IL (US)

(73) Assignee: Shakti Systems, Inc.

( * ) Notice: Subject to any disclaimer, the term of this patent is extended or adjusted under 35 U.S.C. 154(b) by 0 days.

(21) Appl. No.: 10/217,892

(22) Filed: Aug. 12, 2002

(65) Prior Publication Data

US 2003/0038656 A1 Feb. 27, 2003

Related U.S. Application Data

(60) Provisional application No. 60/311,696, filed on Aug. 10, 2001, provisional application No. 60/311,548, filed on Aug. 10, 2001, and provisional application No. 60/311,556, filed on Aug. 10, 2001.

(51) Int. Cl.[7] .............................. H03K 5/22; H03K 7/64
(52) U.S. Cl. ......................................... 327/77; 327/337
(58) Field of Search ............................ 327/77, 65, 67, 327/87, 337, 554, 91, 94, 96; 330/9, 51; 341/122, 172

(56) References Cited

U.S. PATENT DOCUMENTS

| 4,539,551 | A |   | 9/1985  | Fujita et al. ............... 340/347 |
|-----------|---|---|---------|--------------------------------------|
| 4,745,393 | A |   | 5/1988  | Tsukada et al. ............. 340/347 |
| 4,989,003 | A |   | 1/1991  | Sauer ......................... 341/136 |
| 5,036,223 | A |   | 7/1991  | Sakai et al. ................. 307/448 |
| 5,165,058 | A |   | 11/1992 | Nakatani et al. ............ 341/158 |
| 5,262,686 | A |   | 11/1993 | Kurosawa ................... 307/362 |
| 5,329,172 | A |   | 7/1994  | Kohdaka ..................... 307/355 |
| 5,329,187 | A |   | 7/1994  | Crispie et al. ............... 307/494 |
| 5,397,936 | A | * | 3/1995  | Wang ............................ 327/77 |
| 5,546,028 | A |   | 8/1996  | Yamaguchi .................. 327/64  |
| 5,635,864 | A | * | 6/1997  | Jones ........................... 327/77 |
| 5,821,780 | A |   | 10/1998 | Hasegawa ..................... 327/63 |
| 5,847,600 | A | * | 12/1998 | Brooks et al. .................. 330/9 |
| 5,929,662 | A |   | 7/1999  | Alexander et al. ........... 327/67 |
| 5,936,434 | A |   | 8/1999  | Kumamoto et al. .......... 327/77 |
| 5,952,951 | A |   | 9/1999  | Fujino ......................... 341/159 |
| 5,959,469 | A |   | 9/1999  | Kurauchi et al. ............. 327/77 |
| 6,064,239 | A |   | 5/2000  | Matsuoka ..................... 327/63 |
| 6,144,232 | A | * | 11/2000 | Yukawa et al. ................ 327/77 |
| 6,150,850 | A | * | 11/2000 | Kinoshita ..................... 327/77 |
| 6,218,975 | B1|   | 4/2001  | Tsukamoto et al. .......... 341/159 |
| 6,271,691 | B1|   | 8/2001  | Toyoda et al. ................ 327/77 |
| 6,377,200 | B1|   | 4/2002  | Lee ............................. 341/155 |

OTHER PUBLICATIONS

European Patent Office search report in PCT Invitation to Pay Additional Fees for counterpart international application PCT/US02/26555, dated Jan. 22, 2003.
W.J. Tenten and P.R. Shepherd, "New CMOS high–speed, high–accuracy auto–zero comparator design based on symmetric cross–coupled concepts," Int. J. Electronics, vol. 68, No. 3, pp. 405–412, Mar. 1990.

(List continued on next page.)

Primary Examiner—Toan Tran
(74) Attorney, Agent, or Firm—McDonnell Boehnen Hulbert & Berghoff

(57) ABSTRACT

A data comparator that operates on an input voltage signal and a reference voltage signal is disclosed. Internally, the comparator includes replicated circuitry to produce differential gain. Each set of replicated circuitry includes two gain stages for high amplification, high sampling rate, and for reducing kickback noise at the input voltage signal and the reference voltage signal. The comparator may further include self-biased CMOS inverters for cancellation of input offset error and a rail-to-rail regenerative output latch. The circuit can also include a comparator bias circuit that can improve the speed of the auto-zero operation.

29 Claims, 12 Drawing Sheets

OTHER PUBLICATIONS

Andrea Boni, Andrea Pierazzi, and Carlo Morandi, "A 10–b 185–MS/s Track–and–Hold in 0.35–$\mu$m CMOS," IEEE Journal of Solid–State Circuits, vol. 36, No. 2, pp. 195–203, Feb. 2001.

Behzad Razavi and Bruce A. Wooley, "A 12–b. 5–MS/s Two–Step CMOS A/D Converter," IEEE J. of Solid–State Circuits Conference, pp. 36–37, 1992.

Behzad Razavi and Bruce A. Wooley, "Design Techniques for High–Speed, High–Resolution Comparators", IEEE J. of Solid–State Circuits, vol. 27, No. 12, pp. 1916–1926, 1992.

Dwight U. Thompson and Bruce A. Wooley, "A 15–b Pipelined CMOS Floating–Point A/D Converter," IEEE Journal of Solid–State Circuits, vol. 36, No. 2, pp. 299–303, Feb. 2001.

Eduardo Peralías, Adoración Rueda, and José L. Huertes, "CMOS Pipelined A/D Converters with Concurrent Error Detection Capability," IEEE, pp. 437–440, 1998.

Ion E. Opris, Bill C. Wong, and Sing W. Chin, "A Pipeline A/D Converter Architecture with Low DNL," IEEE Journal of Solid–State Circuits, vol. 35, No. 2, pp. 281–285, Feb. 2000.

Iuri Mehr and Larry Singer "A 55–mW, 10–bit, 40–Msample/s Nyquist–Rate CMOS ADC," IEEE Journal of Solid–State Ciruits, vol. 35, No. 3, pp. 318–325, Mar. 2000.

Jungwook Yang and Hae–Seung Lee, "A CMOS 12–bit 4MHz Pipelined A/D Converter with Commutative Feedback Capacitor," IEEE 1996 Custom Integrated Circuits Conference, pp. 437–430.

K. Nagaraj, F. Chen, T. Le, and T. R. Viswanathan, "Effect 6–Bit A/D Converter Using a 1–Bit Folding Front End." IEEE Journal of Solid–State Circuits, vol. 34, No. 8, pp. 1056–1062, Aug. 1999.

Krishnaswamy Nagaraj, H. Scott Fetterman, Joseph Anidjar, Stephen H. Lewis, and Robert G. Renninger, "A 250–mW, 8–b, 52–Msamples/s Parallel–Pipelined A/D Converter with Reduced Number of Amplifiers," IEEE Journal of Solid–State Circuits, vol. 32, No. 3, pp. 312–320, Mar. 1997.

Mikko Waltari, Kari A. I. Halonen, "1–V 9–Bit Pipelined Switched–Opamp ADC," IEEE Journal of Solid State Circuits, vol. 36, No. 1, pp. 129–134, Jan. 2001.

N. Fukishima, T. Yamada, N. Kumazawa, Y. Hasegawa, and M. Soneda, "A CMOS 40 MHz 8b 105mW Two–Step ADC," IEEE Int'l. Solid State Circuits Conf. (ISSCC) Tech. Dig,m pp. 14–15, 273,1989.

Paulux T.F. Kwok and Howard C. Luong, "Power Optimization for Pipeline Analog–to–Digital Converters," IEEE Transactions on Circuits and Systems—II: Analog and Digital Signal Processing, vol. 46, No. 5, pp. 549–553, May 1999.

Sanroku Tsukamoto, William G. Schofield, and Toshiaki Endo, "A CMOS 6–b, 400–MSample/s ADC with Error Correction," IEEE J. of Solid–State Circuits, vol. 33, No. 12, pp. 1939–1947, 1998.

Sung–Ung Kwakm Bang–Sup Song, and Kantilal Bacrania, "A 15–b, 5–Msample/s Low–Spurious CMOS ADC," IEEE J. of Solid–State Circuits, vol. 32, No. 12, pp. 1866–1875, 1997.

Thomas Byunghak Cho and Paul R. Gray, "A 10–b, 20 Msample/s, 35–mW Pipeline A/D Converter," IEEE J. of Solid–State Circuits, vol. 30, No. 3, pp. 166–172, 1995.

Won–Chul Song, Hae–Wook Choi, Sung–Ung Kwak, and Bang–Sup Song, "A 10–b 20–Msample/s Low–Power CMOS ADC," IEEE J. of Solid–State Circuits, vol. 30, No. 3, pp. 514–521, 1995.

Yun–Ti Wang and Behzad Razavi, "An 8–Bit 150–MHz CMOS A/D Converter," IEEE Journal of Solid–State Circuits, vol. 35, No. 3, pp. 308–316, Mar. 2000.

* cited by examiner

HYBRID COMPARATOR AND METHOD

RELATED APPLICATIONS

Priority is claimed to the following Patent Applications:

U.S. Provisional Patent Application No. 60/311,696, entitled "Fast Hybrid Data Comparator," filed on Aug. 10, 2001;

U.S. Provisional Patent Application No. 60/311,548, entitled "Hybrid Data Comparator," filed on Aug. 10, 2001; and U.S. Provisional Patent Application No. 60/311,556, entitled "Starved Hybrid Data Comparator," filed on Aug. 10, 2001;

The entirety of these Patent Applications is expressly incorporated herein by reference.

BACKGROUND

1. Technical Field

The field of the invention is related to data comparators and more particularly to chopper-topology data comparators.

2. Description of Related Art

Data comparators are commonly used when an analog signal (e.g., one that can assume continuously variable voltage and/or current characteristics versus time) must be translated to a digital format. The translation can be performed by an analog-to-digital converter, or "ADC", which is comprised of a number of data comparators. The act of translation is referred to as sampling or digitization.

Applications requiring digitization include, but are not limited to, the digital recording of audio and/or video images, the digital processing of audio and/or video images for transmission or reception, as part of a transducer for processing of non-electrical signals such as mechanical or optical or magnetic sensors, etc. A variety of low-power electronic devices such as mobile stations, personal digital assistants, and digital cameras, to name but a few, rely on digitization of analog signals.

The performance of ADCs may be specified in terms of several basic characteristics including, but not limited to, power dissipation, maximum sampling rate, minimum voltage supply, noise immunity, and complexity. The data comparator drives the fundamental limits of each of these characteristics. Required specifications vary considerably among the applications of ADCs, but many require low power (microwatts/comparator), sample rates over 50 MSPS ($50 \times 10^6$ samples/second), low voltage supply (down to 1V or less), and excellent noise immunity (typically produced by differential signaling).

A known topology that facilitates good characteristic specifications is the chopper topology. The topology features a gain stage, a continual auto-cancellation of offset voltage errors that accrue at the input of the gain stage, relatively low power consumption, high sampling rates, and low voltage supply operation. Several enhancements to the basic chopper topology can further improve circuit characteristics and comprise the prior art. However, prior art chopper-topology comparators typically compromise one or more of the specifications to favor the remainder.

For example, several data comparator topologies require an explicit output latch as an auxiliary circuit. Others require a relatively large number of passive charge storage elements (capacitors), and some have complex clock sequences. Still others, although utilizing differential signaling, make use of only half the differential voltage between the input voltage signal and the reference voltage signal.

Some data comparators employ only a single gain stage, which reduces the differential gain, requires a higher-gain output latch, and leaves the input voltage signal and reference voltage signal susceptible to kickback noise generated by the output latch. Most data comparators also lack a mechanism to prevent unnecessary, excessive current draw by the inverter amplifiers in the latched state.

While typical chopper-topology comparators can satisfy various performance criteria in piecemeal fashion, their ability to do so is degraded as voltage supplies are reduced below 1.5 V due to the aforementioned deficiencies. Thus, a data comparator that offers high performance in all performance categories while operating at low input voltages is desired.

SUMMARY

In a first principal aspect, a method of measuring an input voltage using a first half-cell comparator and a second half-cell comparator is disclosed, wherein each half-cell comparator includes a first amplification stage, a second amplification stage, at least one first coupling component for coupling voltage to the input of the first amplification stage, and at least one second coupling component for coupling an output of the first amplification stage to an input of the second amplification stage. The method may include applying, during an auto-zero time period, the input voltage to the first coupling component of the first half-cell comparator, and also applying a reference voltage to the first coupling component of the second half-cell comparator.

The method may also include applying, during a sample time period, the reference voltage to the first coupling component of the first half-cell comparator, and also applying the input voltage to the first coupling component of the second half-cell comparator during the sample time period.

During a third time period, the latching period, the output of the second amplification stage of the first half-cell comparator may be coupled to the input of the second amplification stage of the second half-cell comparator; also during the third time period, the output of the second amplification stage of the second half-cell comparator may be coupled to the input of the second amplification stage of the first half-cell comparator.

In a second principal aspect, a method of measuring an input voltage using a first half-cell comparator and a second half-cell comparator is disclosed. The method is similar to the method discussed above, but further includes receiving at a control circuit, during a third time period, complementary half-cell outputs from the first and second half-cell comparators, wherein one output is substantially equal to a maximum supply voltage and wherein the complementary output is substantially equal to a minimum supply voltage.

Also during the third time period, the method includes outputting from the control circuit a maximum and a minimum control voltage, wherein the maximum and the minimum control voltage are substantially the same regardless of which half-cell comparator output is substantially equal to the maximum supply voltage and regardless of which half-cell comparator output is substantially equal to the minimum supply voltage.

The method further includes receiving, during the third time period, the maximum and minimum control voltages at the first amplification stage of each half-cell comparator, and disabling the first amplification stage of each half-cell comparator in response to the control voltages.

In a third principal aspect, a voltage measuring circuit comprising a first half-cell comparator and a second half-cell comparator is disclosed. Each half-cell comparator can include a first amplification stage, at least one first coupling component (such as a capacitor) for coupling voltage to the input of the first amplification stage. The circuit may also include a first pair of complementary clocked analog switches for applying either a reference voltage or an input voltage to each first coupling component, the first pair of complementary clocked analog switches connected so that when the input voltage is applied to the first half-cell, the reference voltage is applied to the second half-cell, and when the reference voltage is applied to the first half-cell, the input voltage is applied to the second half-cell.

The circuit may further include a second amplification stage and at least one second coupling component for coupling the output of the first amplification stage to the input of the second amplification stage. The output of the second amplification stage can be latched by a cross-coupling clocked analog switch that connects the output of the second amplification stage of one half-cell to the input of the second amplification stage of the other half-cell.

BRIEF DESCRIPTION OF THE DRAWINGS

The above and other features of the present invention will become more apparent from the following detailed description taken with the accompanying drawings in which.

DETAILED DESCRIPTION

Figure 1A:
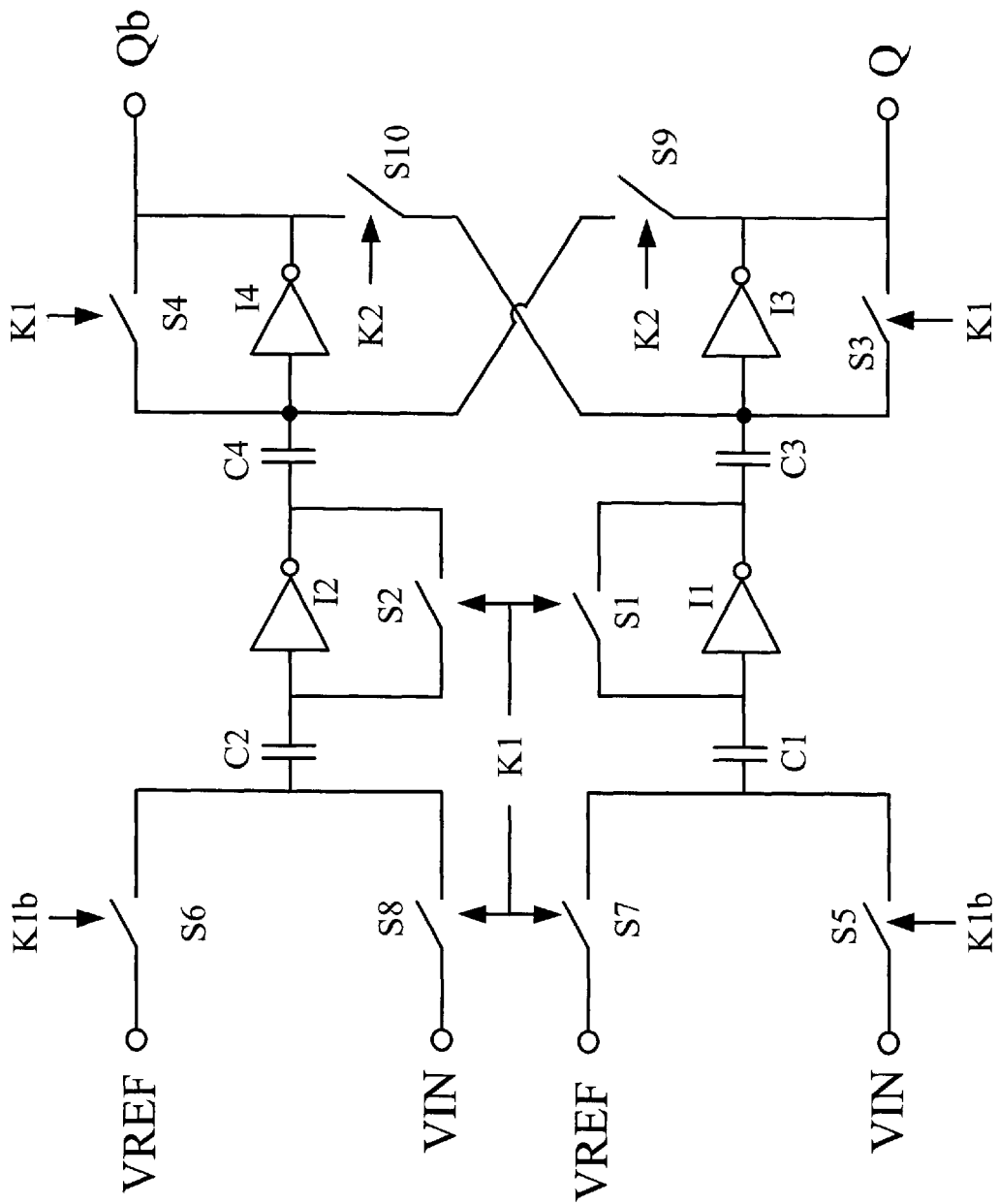
FIG. 1A is a schematic view of a comparator in accordance with an exemplary embodiment of the invention.

FIG. 1A is a schematic diagram of a chopper-topology comparator in accordance with an exemplary embodiment of the invention. It is contemplated that the comparator would be fabricated in quantity, along with additional circuitry such as switches and other components, to implement a complete analog-to-digital comparator using existing integrated circuit (IC) fabrication techniques and materials (e.g. CMOS, BiCMOS, silicon, gallium arsenide, germanium, etc.). A typical use for a number of comparators as described here could include, for example, 8-bit, 12-bit and 16-bit, 300MS/s flash ADCs, where each comparator produces thermometer code output that can be used to create a binary coded output of the desired number of bits.

The comparator may be designed to operate from a range of supply voltages. The upper limit of supply voltage is determined by reliability constraints such as dielectric breakdown, punch-through, avalanche breakdown, and hot carrier effects. Typical values in present state-of-the-art manufacturing processes range from 3V to 5V. The lower limit of supply voltage is determined by the transistor threshold voltage (VT) such that the minimum voltage is approximately twice VT. Typical VT values in present state-of-the-art manufacturing processes are about 0.3 V to 0.6 V. Thus, exemplary embodiments of the comparator using state-of-the-art and future semiconductor manufacturing processes can achieve sampling rates of 1 to 1,000 Megasamples per second (MSPS) using a supply voltage of about 0.5V to about 5V. In operation, the comparator could consume from about 10 nanowatts to about 100 microwatts of power, although operation at other power levels is possible.

Figure 2C:
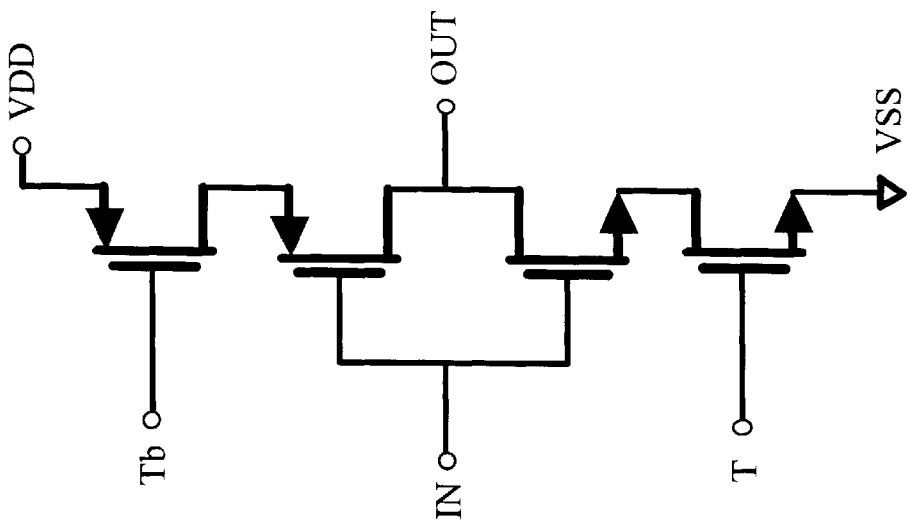
FIG. 2C illustrates an inverter amplifier with control terminals that may be used in accordance with a low-power embodiment of the invention.
Figure 2B:
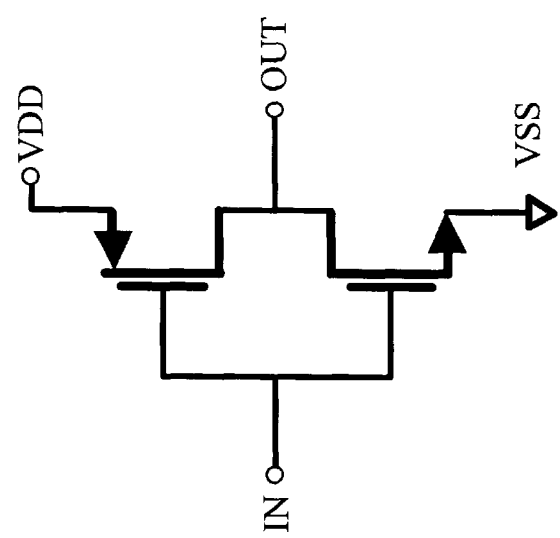
FIG. 2B illustrates an inverter amplifier that may be used in accordance with the invention.
Figure 2A:
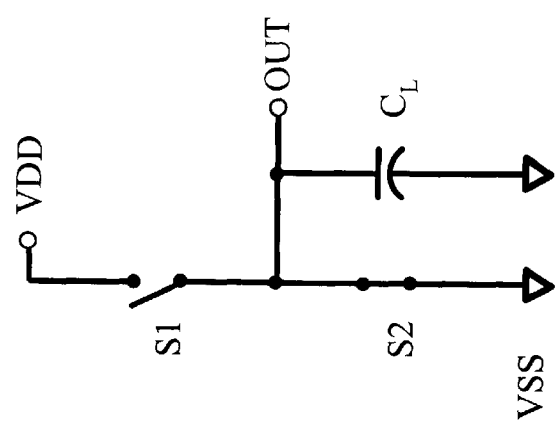
FIG. 2A illustrates a switch level representation of an inverter that may be used in accordance with the invention.

In an exemplary embodiment, the comparator of the present invention comprises two half-cells operated differentially. Each half-cell may include 1) an input selector, 2) first- and second-stage inverting amplifiers, and 3) cross-coupling analog switches to implement a regenerative latch. Functional equivalents to analog switches are also possible. FIG. 2A is a switch level representation of an inverter circuit that can be used in accordance with the invention. When S1 is open and S2 is closed, as shown, the circuit is equivalent to a high-input, low-output condition, where S2 discharges the capacitive load $C_L$. When S2 is open and S1 is closed (not shown), the circuit is equivalent to a low-input, high-output condition, since S1 will charge $C_L$. FIG. 2B illustrates a possible configuration of one of the inverter amplifiers that may be used in exemplary embodiments of the invention, while FIG. 2B illustrates an alternative inverter amplifier that may be used in accordance with a low-power or "starved" hybrid comparator, to be described in detail below.

Figure 3C:
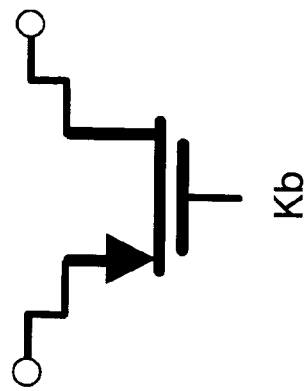
FIG. 3C illustrates another alternative analog switch that may be used in accordance with the invention.
Figure 3B:
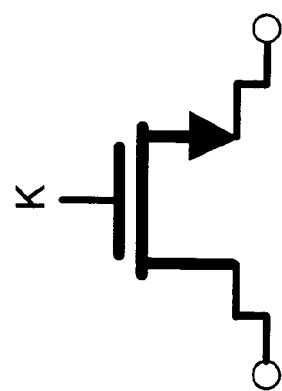
FIG. 3B illustrates an alternative analog switch that may be used in accordance with the invention.
Figure 3A:
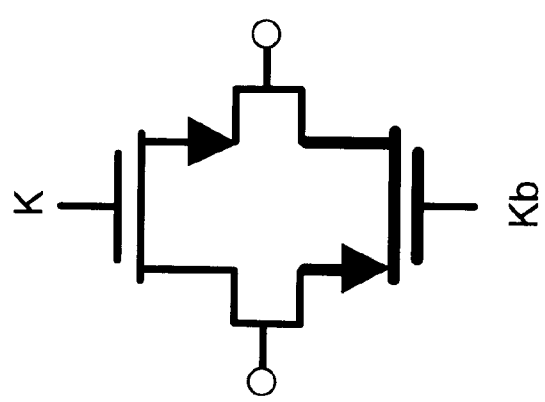
FIG. 3A illustrates an analog switch that may be used in accordance with the invention.

A number of analog switches may be used in accordance with the invention, and FIGS. 3A, 3B, and 3C show several specific configurations of an analog switch that may be used in exemplary embodiments of the invention, although the particular configuration of any analog switch is not necessarily critical to all embodiments of the invention. Switches used in accordance with the invention can be designed (i.e., switch width can be chosen) to operate in the linear region for fast recovery. Besides designing for fast recovery, the complementary configuration of FIG. 3A can be utilized to cancel clock feedthrough currents that contribute to systematic error in the DC quiescent point. For the complementary configuration, low resistance is achieved by ensuring the transistors operate in the linear region. A switch may therefore be modeled as a single NMOS with a transconductance equal to the combination of both transistors. As an additional design consideration, a wide switch results in a low drain-source voltage, but the additional capacitance can result in a slow, underdamped response, whereas a narrow switch has a fast underdamped response, so a narrow switch may be preferred.

Switches S6 and S8 (FIG. 1A, 1B, and 1C) form a complementary clocked pair of analog switches; when S6 is closed, S8 will be open, and vice-versa. Switches S5 and S7 (FIGS. 1A, 1B, and 1C) form a similar complementary clocked pair for the other half-cell comparator, with input voltages reversed from those of S6 and S8, so that when an input voltage is applied to the first half-cell, a reference voltage is applied to the second half-cell, and when the reference voltage is applied to the first half-cell, the input voltage will be applied to the second half-cell.

Switches S1, S2, S3, and S4 (FIGS. 1A, 1B, and 1C) may be referred to as clocked auto-zero analog switches; switches S9 and S10 (FIGS. 1A, 1B, and 1C) may be referred to as cross-coupling clocked analog switches; and switches S11 and S12 (FIG. 1B) may be referred to as clocked bias-control analog switches.

Figure 4:
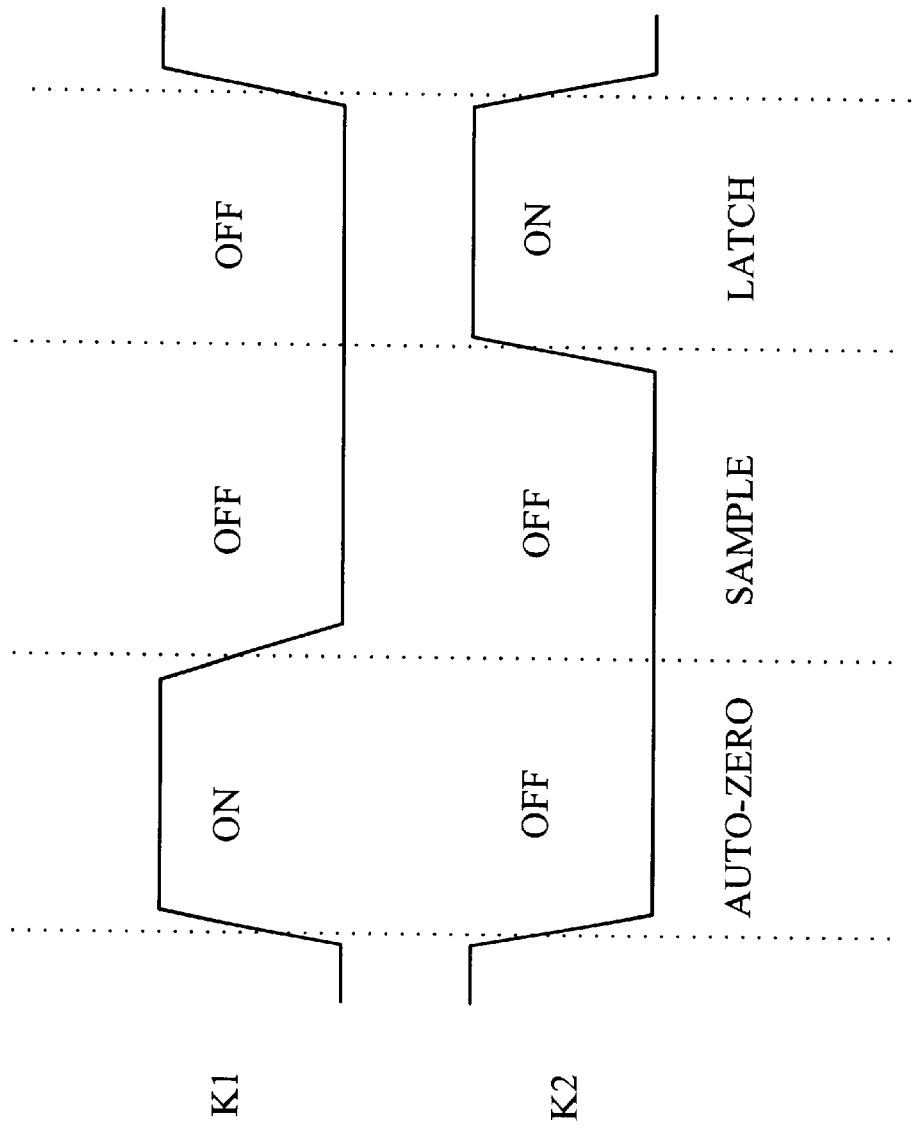
FIG. 4 shows the waveforms of clock signals applicable to control the comparator of the exemplary embodiment.
Figure 5B:
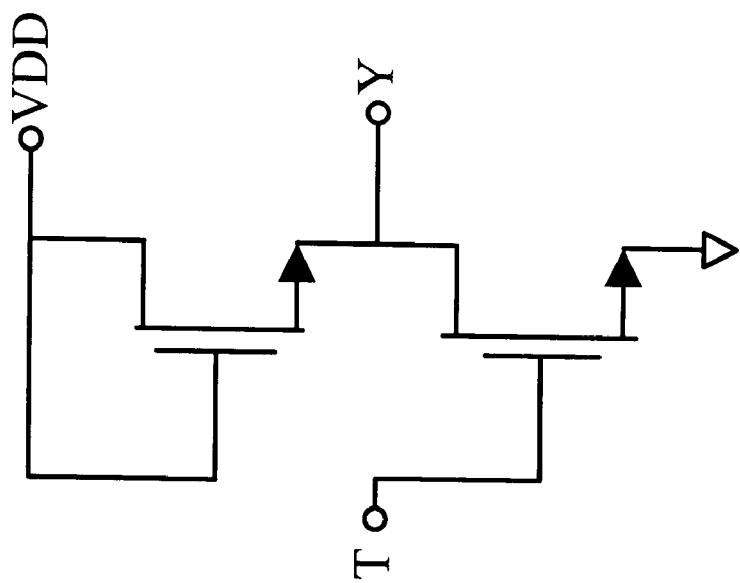
FIGS. 5A–5E illustrate NMOS implementations of a bias circuit that may be used in accordance with the invention.
Figure 5A:
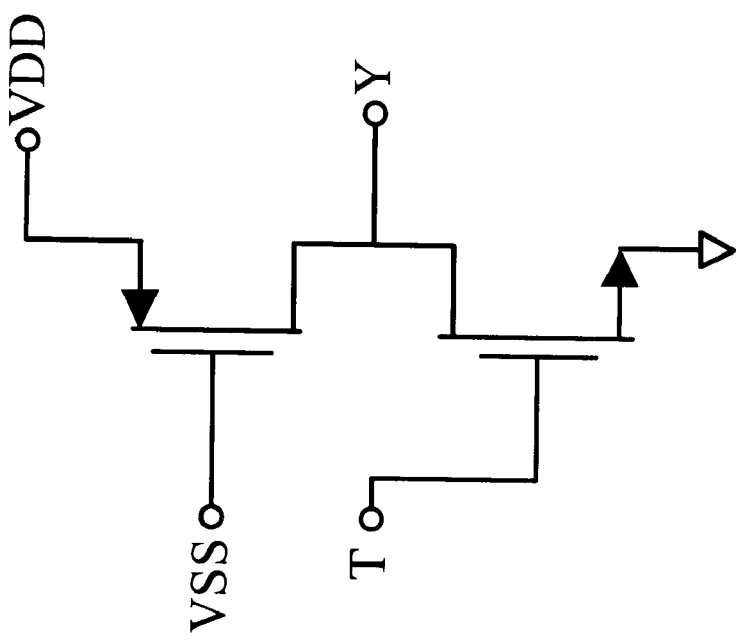
Figure 5D:
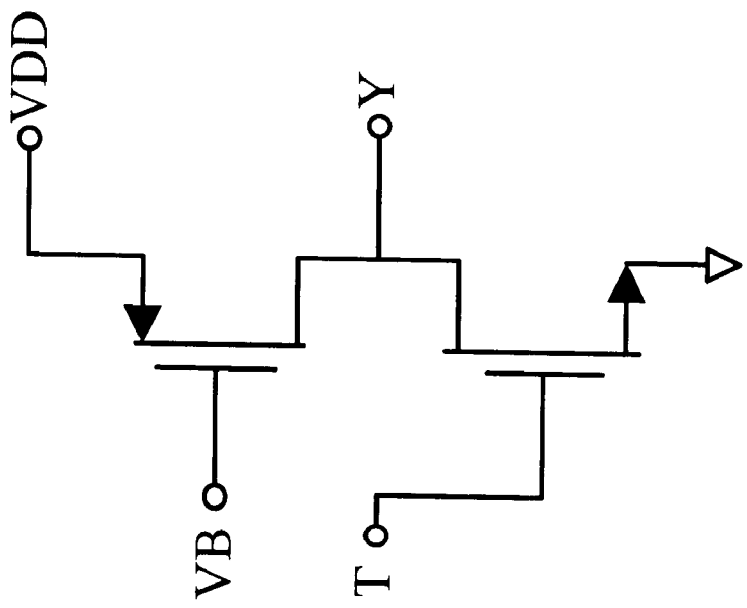
Figure 5C:
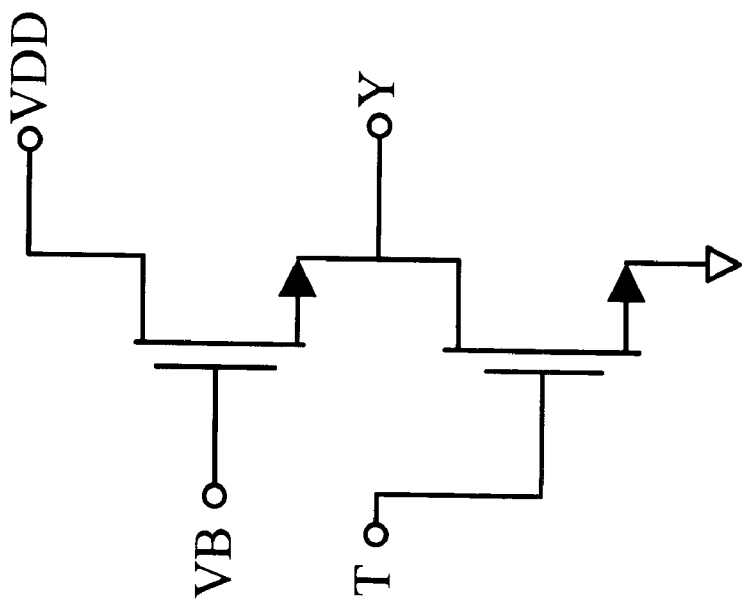
Figure 5F:
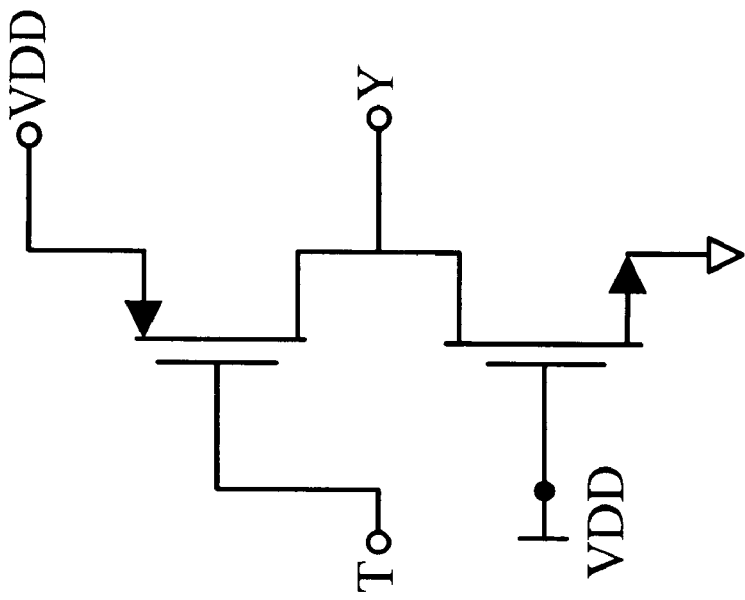
FIGS. 5F–5J illustrate PMOS implementations of a bias circuit that may be used in accordance with the invention.
Figure 5E:
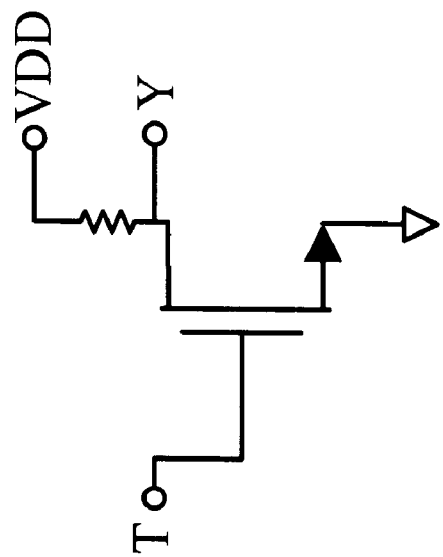
Figure 5H:
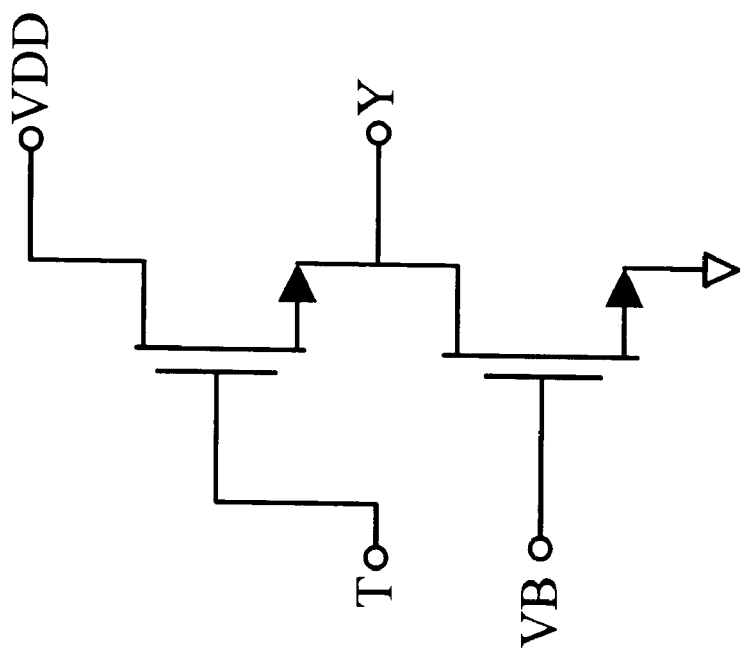
Figure 5G:
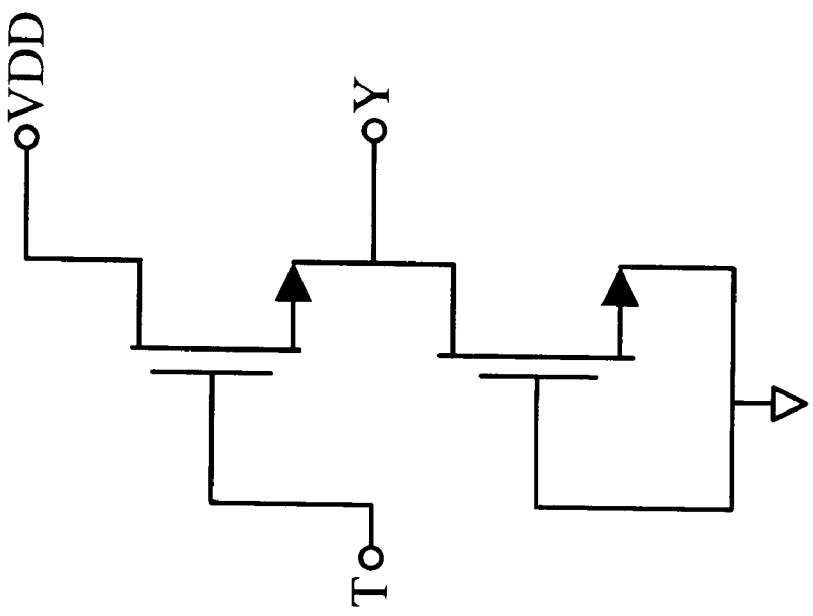
Figure 5J:
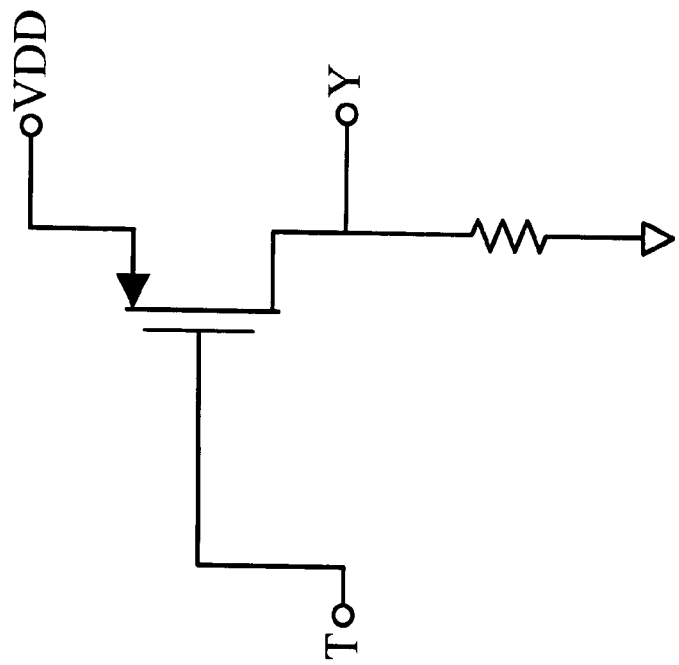
Figure 5I:
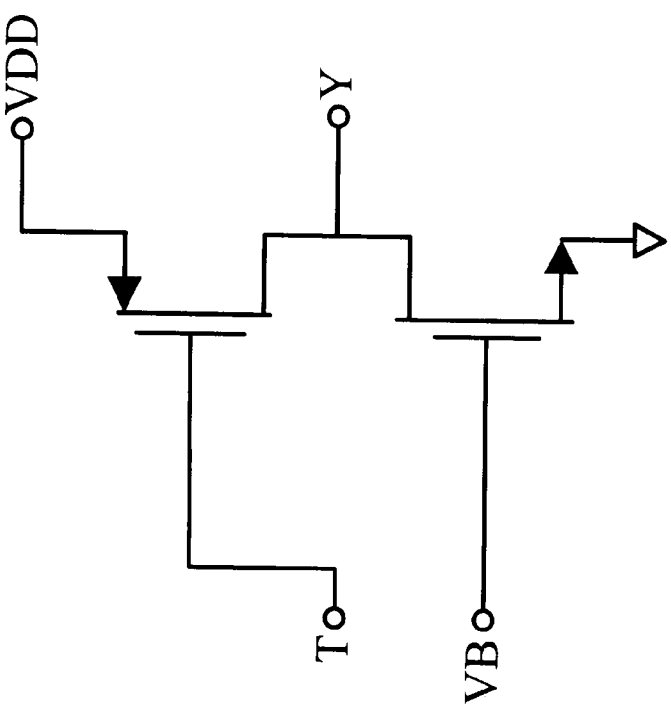

The clock sequencing of the comparator is illustrated in FIG. 4. As indicated, three time periods are produced and performed repeatedly. Two clock signals, K1 and K2, represent the logic defining the time periods. The logic complements, K1$b$ and K2$b$, can also be used to control the comparators.

Auto-Zero Period

In the first time period, also referred to as the auto-zero period, K1 is asserted (at its maximum voltage) and K2 is deasserted (at its minimum voltage). This causes analog switches S1, S2, S3, S4, S7, and S8 to close and switches S5, S6, S9, and S10 to open. During this period, each inverting amplifier I1, I2, I3, and I4 has its input and output coupled together by the analog switches, which causes the input and output voltage to assume a potential of approximately one-half of the voltage supply due to the quiescent operating current that results from the geometry of the transistors of the inverting amplifiers when the output voltage equals the input voltage. The NMOS and PMOS transistors of each half-cell's inverters may be sized so the inverter threshold is about Vdd/2, which implies $\beta_n \approx \beta_p$ and $V_{T,n} \approx V_{T,p}$.

Both transistors of an inverter are assumed to be operating in the saturation region, corresponding to the small-signal input and output relative to a $V_{dd}/2$ reference during auto-zero. This synchronous auto-zero operation reduces or eliminates common mode noise, and also reduces or eliminates input offset voltage error that is inherent in some ADC comparators that use differential pair topologies.

During auto-zero, capacitor C1 samples the potential of the reference voltage signal VREF because S7 is closed and S5 is open. Similarly, capacitor C2 samples the potential of the input voltage signal VIN because S8 is closed and S6 is open. In a similar manner, capacitor C3 samples the potential of the output of the inverting amplifier I1 and capacitor C4 samples the potential of the output of the inverting amplifier I2.

Sample Period

In the second time period, also referred to as the sample period, K2 remains at minimum voltage and K1 is deasserted (at its minimum voltage), causing analog switches S1, S2, S3, S4, S7, and S8 to open, and causing switches S5, S6, S9, and S10 to close. Since the inputs to the first stage of each half cell are reversed, the half cells always operate 180 degrees out of phase with each other so that one produces a positive differential signal while the other produces a negative differential signal, as follows. During the sample period, each inverting amplifier I1, I2, I3, and I4 is free to operate on any signal at its input and deliver the amplified and inverted signal to its output. Also during this period, capacitor C1 now samples the potential of the input voltage signal VIN because S5 is closed and S7 is open, and capacitor C2 now samples the potential of the reference voltage signal VREF because S6 is closed and S8 is open. This causes a differential voltage (VIN−VREF) to be transferred to C1 and a differential voltage (VREF−VIN) to be transferred to C2. The differential signals propagate through first-stage inverting amplifiers I1 and I2 and are transferred to capacitors C3 and C4, and then through second-stage inverting amplifiers I3 and I4. Since two inverting amplifiers are present in each half-cell, the half-cell input and output signals have the same polarity. At the end of the second time period, the half-cell outputs Q and Qb have amplified signals corresponding to (VIN−VREF) and (VREF−VIN), respectively.

In an equivalent small-signal model, each half-cell acts as a cascade of two low-pass filters (which can be modeled as a passive RC filter) and two small-signal inverting amplifiers. The "resistance" of the low-pass filters is contributed by the small-signal impedance of C1 and C2, and the capacitance is due to the relatively small inverter input capacitances $C_i$. The effect of the equivalent low-pass filter is negligible, however, for the following reason. A small-signal input of $v_{A0}$ to the first equivalent filter is attenuated by $C/C+C_i$, but C is much larger than $C_i$, so the attenuation factor is approximately 1.

Within each half cell, the first inverter provides a first stage small-signal gain, and the second inverter provides a second stage small-signal gain to further boost the differential gain prior to latching. If required, more stages could be used to provide additional gain. Since each half cell is fully differential, excellent power supply rejection is realized.

Latch Period

In the third time period, also referred to as the latch period, K1 remains at minimum voltage and K2 is asserted (at its maximum voltage), causing analog switches S9 and S10 to close. During this period the last inverting amplifier in each half-cell (I3 and I4) is connected in an integral positive-feedback regenerative latch via analog switches S9 and S10. As in the auto-zero period, the analog switches are designed to ensure operation in the linear region. As a result of the positive feedback, the differential voltages present at outputs Q and Qb from the sample period are driven to full rail potentials (i.e., to approximately the maximum or minimum possible potential), where they remain irrespective of changes in the input voltage. During latching, one transistor in an inverter will be saturated and the other will be operating in linear mode, resulting in the final rail-to-rail outputs. The latch period concludes when K1 is asserted (at its maximum voltage) and K2 is deasserted (at its minimum voltage). When K1 is asserted, switches S7, and S8, S1, S2, S3, and S4 close. Since K1$b$ is deasserted, switches S5, S6 will open, while K2 causes switches S9 and S10 to open, and operation returns to the auto-zero period.

In the exemplary embodiment, the use of two gain stages in each half-cell shields the input voltage signal and the reference voltage signal from kickback noise produced by the large voltage transitions of the regenerative output latch. As the second-stage inverters (I3 and I4) latch, the first-stage inverters (I1 and I2) create virtual grounds at capacitors C3 and C4, which blocks the backwards propagation of kickback noise from the outputs Q and Qb to the inputs VREF and VIN. The use of two gain stages also increases the speed of the latching operation since the voltage levels at Q and Qb begin closer to their latched values.

As another feature, the use of replicated input selectors using the analog switch pairs S5/S7 and S6/S8 permits each half-cell to operate on the full differential signal |VIN−VREF|.

In operation, as clock signal K1 oscillates between its maximum and minimum voltage, the input voltage signal VIN is alternately connected to C1 via S5 or to C2 via S8. Consequently, if C1 and C2 have equal capacitance then the capacitive loading of VIN is nearly constant throughout all time periods. Similarly, the reference voltage signal VREF is alternately connected to C1 via S7 or to C2 via S6, so if C1 and C2 have equal capacitance then the capacitive loading of VREF is nearly constant throughout all time periods. This uniform loading contributes to improved stability of the potentials at VIN and VREF.

Experimental prototypes of the comparators were fabricated in a 0.5 μm, single-poly, triple-metal CMOS technology with transistor threshold voltages of $V_{Tn}$=0.72V and $V_{Tp}$=−0.085V. A 2.25–fF/μm² poly/n+ linear capacitor option was used. Two versions of the hybrid comparator were fabricated, with sampling capacitance of 400 fF and 800 fF, respectively; die areas were 414×56 μm² and 494×56 μm, respectively. A single version of the starved hybrid comparator, described below, was fabricated with a sampling capacitance of 400 fF; die area for this version is 492×56 μm². Measured input offset in all versions is about 250 μV. Measured harmonic distortion, known to underestimate actual performance, was generally better than −30 dB. Simulations indicated successful latching to 500 MS/s, making the performance of these comparators among the highest reported in terms of sample rate, power dissipation, and low-voltage operation.

High-Speed Operation

Figure 1B:
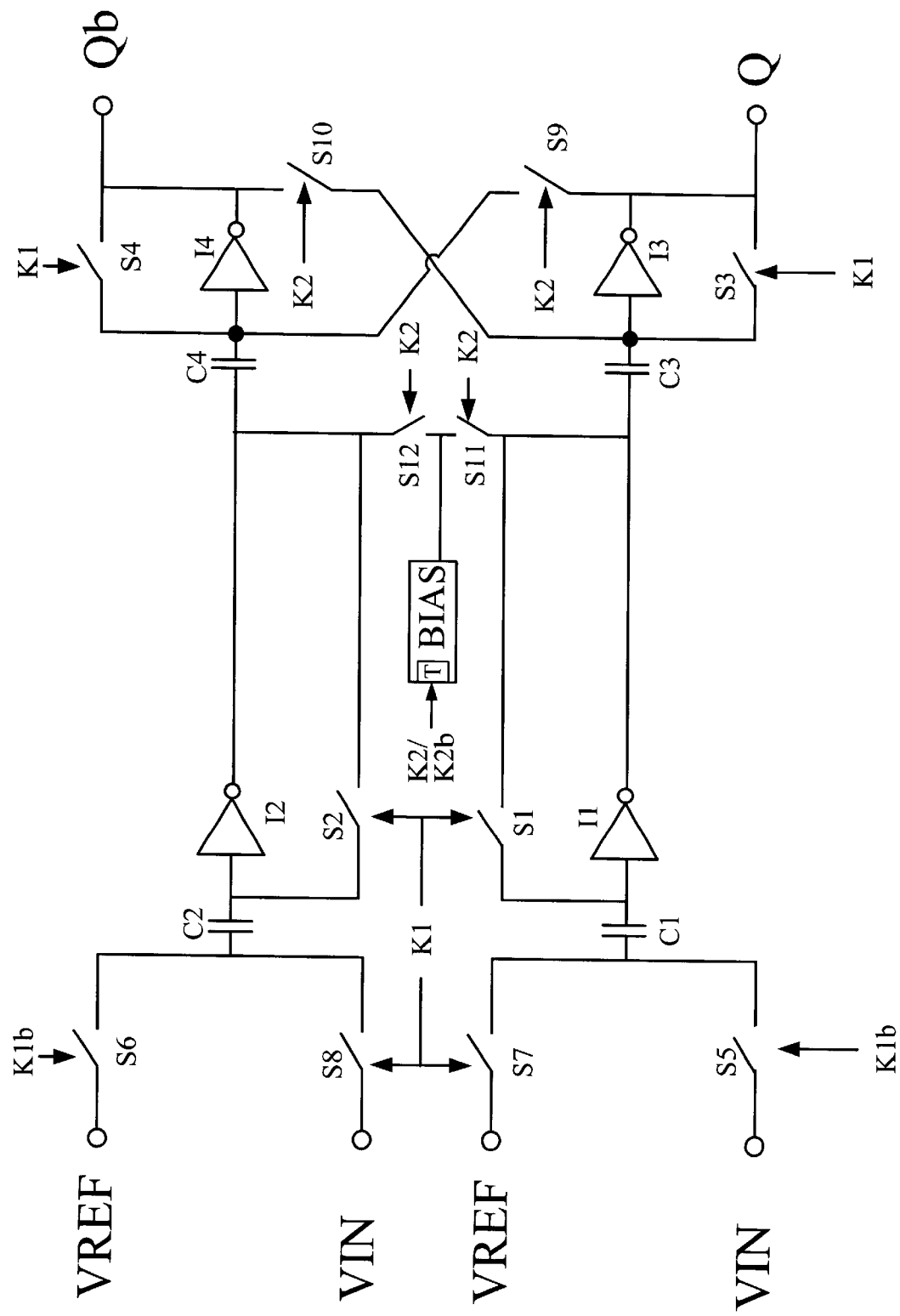
FIG. 1B is a schematic view of a fast comparator in accordance with an alternative exemplary embodiment of the invention.

FIG. 1B is a schematic diagram of a high-speed chopper-topology comparator in accordance with an alternative exemplary embodiment of the invention. The topology is similar to that of the basic hybrid comparator of FIG. 1A, with the addition of one or more bias circuits as shown in FIGS. 5A–5J. The bias circuit in this embodiment can shorten the auto-zero period by initiating the auto-zero of capacitors C3 and C4 during the latching period rather than during the subsequent auto-zero period, with a corresponding increase in sample rate. In order to take advantage of this feature, it may be desirable (but not necessary) to use asymmetric clock signals (e.g., an auto-zero period that is shorter than the other periods; other differences in timing are possible as well). During the latching period, the bias circuit is applied to C4 and C5 because K2 is asserted, which closes clocked bias-control switches S11 and S12. The circuits of FIGS. 5A–5J also provide a low-impedance noise discharge path that can significantly reduce the time required for decay of latch kickback noise. Faster decay of kickback noise allows for a shorter latch time period, thus, an increased maximum sample rate. Without such a low-impedance path, larger devices must be used to achieve high sampling rates, which results in a commensurate increase in power consumption.

K2 or K2b also turns on or "clocks" the drive transistors of the bias circuit(s) during the latch period, making it active. In the self-biased embodiments of FIGS. 5B, 5C, 5F, 5G, 5H, and 5K, the MOSFET gate dimensions and/or resistor values are designed to ensure that the potential of the output terminal Y is approximately one-half the voltage supply when the bias circuit is active. Similarly, in the externally-biased embodiments of FIGS. 5D, 5E, 5I, and 5J, the MOSFET gate dimensions and the external voltage signal VB ensure that the potential of the output side terminal Y is approximately one-half the voltage supply when the bias circuit is active. Of course, other bias voltages are possible as well, and may be desirable in specific applications.

The bias circuit can be isolated from the comparator by analog switches S11 and S12 (FIG. 1B) so it does not perturb the nodal voltages during the auto-zero or sampling period. In addition, to prevent unnecessary current draw in the bias circuit during those periods, clock signal K2 is applied to terminal T of NMOS-input embodiments of the bias circuit (FIGS. 5A–5E) and complementary clock signal K2b is applied to terminal T of PMOS-input embodiments of the bias circuit (FIGS. 5F–5J), disabling the bias circuit when it is not needed.

Low Power Operation

Figure 1C:
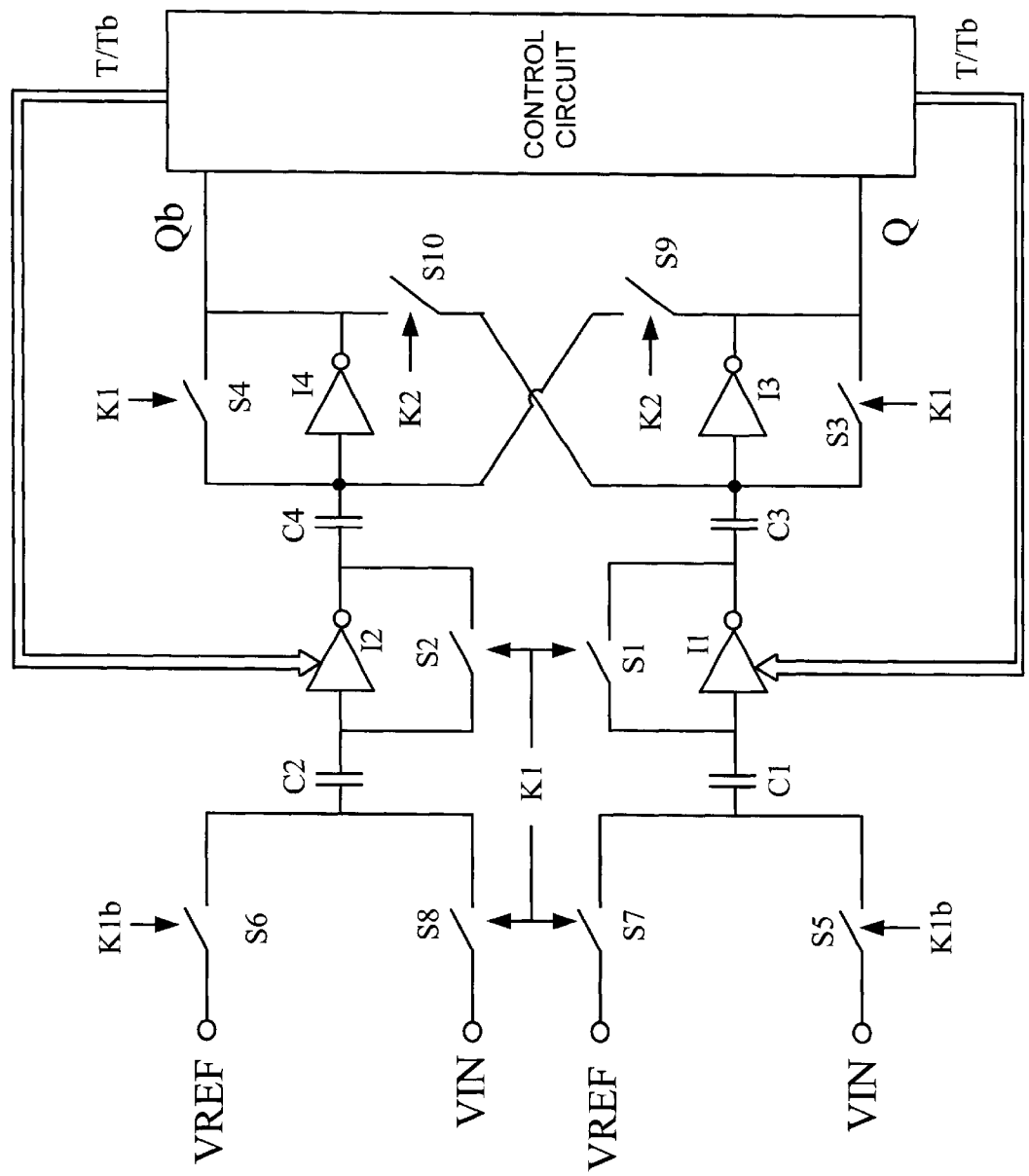
FIG. 1C is a schematic view of a low-power comparator in accordance with another alternative exemplary embodiment of the invention.
Figure 6:
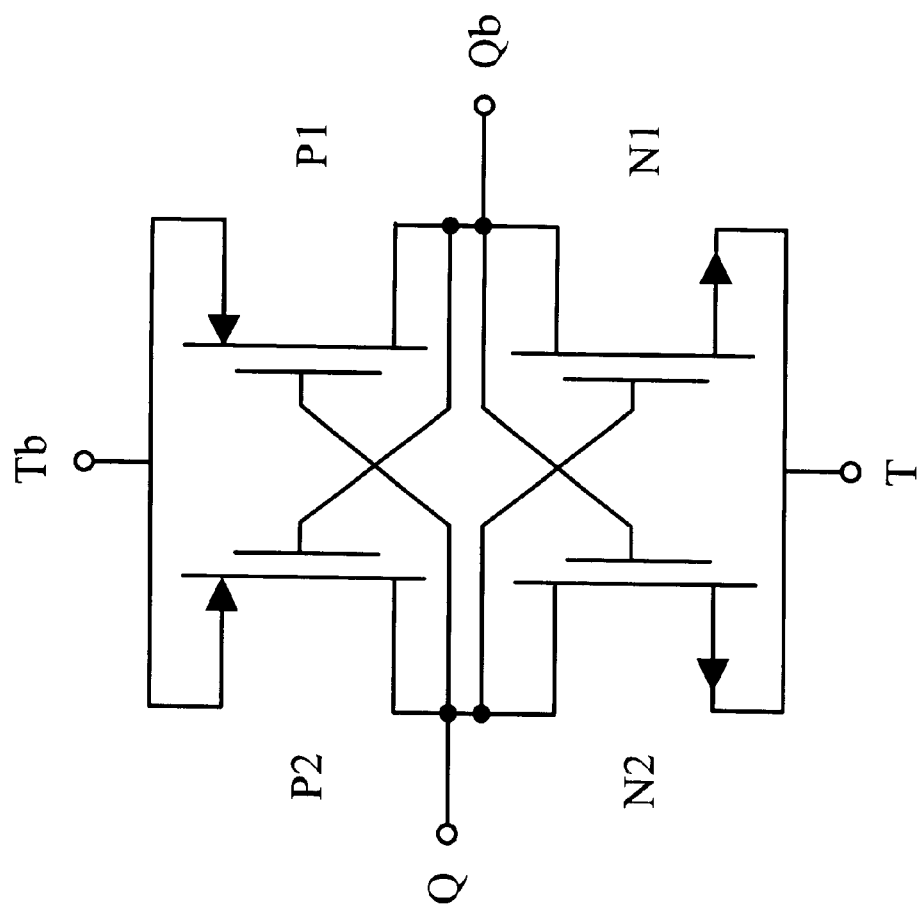
FIG. 6 illustrates a control circuit that may be used in accordance with a low-power embodiment of the invention.

FIG. 1C is a schematic diagram of a starved hybrid chopper-topology comparator in accordance with an alternative exemplary embodiment of the invention. In addition to the basic configuration of FIG. 1A, the low power starved comparator circuit of FIG. 1C includes a comparator control circuit as shown in FIG. 6 whose outputs, T and Tb, can be applied to the control terminals T and Tb of the inverting amplifier shown in FIG. 2B. The two control terminals are driven when the inverter can be inactive in order to reduce or eliminate power consumption in the first amplifier stage during a particular period or periods.

As discussed above, during the latch period, comparator outputs Q and Qb are at or near full rail potential. Referring now to FIG. 6, regardless of whether Q is high and Qb is low or vice-versa, control circuit output T will be low and Tb will be high whenever Q and Qb are at opposite supply rails, for the following reasons. First, assume Q is high and Qb is low; Q will drive NMOS transistor N1 "on", so there will be a low impedance path from the drain (which is low due to Qb) to the source, which is tied to output T. Transistor N2 will be driven "off" by Qb, and thus will not affect the voltage at T. Conversely, when Q is low and Qb is high, the source of N2 will pull T low, and N1 will be off. Similarly, when Q is high and Qb is low, Qb will drive PMOS transistor P2 "on", so there will be a low impedance path from the drain (which is high due to Q) to the source, which is tied to output Tb. Transistor P1 will be driven "off" by Q, and thus will not affect the voltage at Tb. Conversely, when Q is low and Qb is high, the source of P1 will pull Tb high, and P2 will be off. The following table indicates the operation of the control circuit.

| Q | Qb | T | Tb |
|---|----|---|----|
| 1 | 0 | 1 | 0 |
| 0 | 1 | 1 | 0 |
| 0 < Q < 1 | 0 < Qb < 1 | bias voltage | bias voltage |

Referring now to FIG. 2B, it can be seen that a low input to the T control terminal will drive the lower NMOS transistor to cutoff, and the high input to the Tb control terminal will drive the upper PMOS transistor to cutoff, thus "starving" inverting amplifiers I1 and I2 during the latch period when they can be inactive.

Both the high-speed and the low-power or starved comparator configurations (or selected features of them) can be implemented at the same time, yielding very fast operation while consuming minimal power. In addition, various features described above can be used while others are left out, resulting in combinations other than those described in detail here.

Although several possible embodiments of an apparatus and method have been described, various changes and modifications may be made or suggested by those skilled in the art without departing from the spirit or scope of the claims that follow.

I claim:

1. A method of measuring an input voltage using a first half-cell comparator and a second half-cell comparator, wherein each half-cell comparator includes a first amplification stage, a second amplification stage, at least one first coupling component for coupling voltage to the input of the first amplification stage, and at least one second coupling component for coupling an output of the first amplification stage to an input of the second amplification stage, the method comprising:
  applying, during a first time period, the input voltage to the first coupling component of the first half-cell comparator;
  applying, during the first time period, a reference voltage to the first coupling component of the second half-cell comparator;
  applying, during a second time period, the reference voltage to the first coupling component of the first half-cell comparator;
  applying, during the second time period, the input voltage to the first coupling component of the second half-cell comparator;
  coupling, during a third time period, the output of the second amplification stage of the first half-cell comparator to the input of the second amplification stage of the second half-cell comparator; and
  coupling, during the third time period, the output of the second amplification stage of the second half-cell comparator to the input of the second amplification stage of the first half-cell comparator.

2. The method of claim 1, wherein the first coupling component and the second coupling components have capacitance.

3. The method of claim 1, wherein applying the input voltage and the reference voltage comprises activating analog switches to conductively couple voltages to the first and second coupling components.

4. The method of claim 1, further comprising:
  removing, during the first time period, the reference voltage from the first coupling component of the first half-cell comparator;
  removing, during the first time period, the input voltage from the first coupling component of the second half-cell comparator;
  removing, during the second time period, the input voltage from the first coupling component of the first half-cell comparator; and
  removing, during the second time period, the reference voltage from the first coupling component of the second half-cell comparator.

5. The method of claim 1, further comprising coupling, during the first time period, the outputs of the first amplification stage of the first and second half-cell comparators to their respective inputs.

6. The method of claim 5, further comprising decoupling the outputs of the first amplification stage of the first and second half-cell comparators from their respective inputs during at least the second time period.

7. The method of claim 1, wherein each amplification stage comprises a CMOS logic gate.

8. A method of measuring an input voltage using a first half-cell comparator and a second half-cell comparator, wherein each half-cell comparator includes a first amplification stage, a second amplification stage, at least one first coupling component for coupling voltage to the input of the first amplification stage, and at least one second coupling component for coupling an output of the first amplification stage to an input of the second amplification stage, wherein the first coupling component and the second coupling components have capacitance, the method comprising:
  deactivating a first analog switch to remove, during a first time period, a reference voltage from the first coupling component of the first half-cell comparator;
  activating a second analog switch to apply, during the first time period, the input voltage to the first coupling component of the first half-cell comparator;
  deactivating a third analog switch to remove, during the first time period, the input voltage from the first coupling component of the second half-cell comparator;
  activating a fourth analog switch to apply, during the first time period, the reference voltage to the first coupling component of the second half-cell comparator;
  deactivating the second analog switch to remove, during a second time period, the input voltage from the first coupling component of the first half-cell comparator;
  coupling, during the first time period, the outputs of the first amplification stage of the first and second half-cell comparators to their respective inputs;
  activating the first analog switch to apply, during the second time period, the reference voltage to the first coupling component of the first half-cell comparator;
  deactivating the fourth analog switch to remove, during the second time period, the reference voltage from the first coupling component of the second half-cell comparator;
  activating the third analog switch to apply, during the second time period, the input voltage to the first coupling component of the second half-cell comparator;
  decoupling the outputs of the first amplification stage of the first and second half-cell comparators from their respective inputs during at least the second time period
  coupling, during a third time period, the output of the second amplification stage of the first half-cell comparator to the input of the second amplification stage of the second half-cell comparator; and
  coupling, during the third time period, the output of the second amplification stage of the second half-cell comparator to the input of the second amplification stage of the first half-cell comparator.

9. The method of claim 8, wherein coupling comprises activating analog switches, and wherein decoupling comprises deactivating analog switches.

10. A method of measuring an input voltage using a first half-cell comparator and a second half-cell comparator, wherein each half-cell comparator includes at least one amplification stage and at least one first coupling component for coupling voltage to the input of the at least one amplification stage, the method comprising:
  applying, during a first time period, the input voltage to the first coupling component of the first half-cell comparator;
  applying, during the first time period, a reference voltage to the first coupling component of the second half-cell comparator;
  applying, during a second time period, the reference voltage to the first coupling component of the first half-cell comparator;

applying, during the second time period, the input voltage to the first coupling component of the second half-cell comparator;

during a third time period, receiving, at a control circuit, complementary half-cell outputs from the first and second half-cell comparators, wherein one output is substantially equal to a maximum supply voltage and wherein the complementary output is substantially equal to a minimum supply voltage;

during the third time period, outputting from the control circuit a maximum and a minimum control voltage, wherein the maximum and the minimum control voltage are substantially the same regardless of which half-cell comparator output is substantially equal to the maximum supply voltage and regardless of which half-cell comparator output is substantially equal to the minimum supply voltage;

receiving, during the third time period, the maximum and minimum control voltages at the at least one amplification stage of each half-cell comparator; and disabling the at least one amplification stage of each half-cell comparator in response to the control voltages.

11. The method of claim 10, wherein each half-cell comparator also includes a second amplification stage and at least one second coupling component for coupling an output of the first amplification stage to an input of the second amplification stage, the method further comprising:

coupling, during a third time period, the output of the second amplification stage of the first half-cell comparator to the input of the second amplification stage of the second half-cell comparator; and coupling, during the third time period, the output of the second amplification stage of the second half-cell comparator to the input of the second amplification stage of the first half-cell comparator;

whereby coupling the outputs during the third time period latches the outputs during the third time period.

12. The method of claim 11, wherein the complementary half-cell outputs from the first and second half-cell comparators comprise the outputs of the latched second amplification stages of the half-cell comparators.

13. A method of measuring an input voltage using a first half-cell comparator and a second half-cell comparator, wherein each half-cell comparator includes a first amplification stage, a second amplification stage, at least one first coupling component for coupling voltage to the input of the first amplification stage, and at least one second coupling component for coupling an output of the first amplification stage to an input of the second amplification stage, the method comprising:

applying, during a first time period, the input voltage to the first coupling component of the first half-cell comparator;

applying, during the first time period, a reference voltage to the first coupling component of the second half-cell comparator;

applying, during a second time period, the reference voltage to the first coupling component of the first half-cell comparator;

applying, during the second time period, the input voltage to the first coupling component of the second half-cell comparator; and coupling, during a third time period, a bias voltage to the output of the first amplification stage of each half-cell comparator.

14. The method of claim 13, further comprising:

coupling, during the third time period, the output of the second amplification stage of the first half-cell comparator to the input of the second amplification stage of the second half-cell comparator; and coupling, during the third time period, the output of the second amplification stage of the second half-cell comparator to the input of the second amplification stage of the first half-cell comparator.

15. The method of claim 14, further comprising providing a low-impedance noise discharge path between the output of the first amplification stage of each half-cell comparator and the bias voltage source.

16. The method of claim 15, wherein coupling the bias voltage and providing the low-impedance noise discharge path comprises coupling an output of a bias circuit to the output of the first amplification stage of each first half-cell comparator.

17. A method of measuring an input voltage using a first half-cell comparator and a second half-cell comparator, wherein each half-cell comparator includes a first amplification stage, a second amplification stage, at least one first coupling component for coupling voltage to the input of the first amplification stage, and at least one second coupling component for coupling an output of the first amplification stage to an input of the second amplification stage, the method comprising:

during a first time period:
applying the input voltage to the first coupling component of the first half-cell comparator;
applying a reference voltage to the first coupling component of the second half-cell comparator;

during a second time period:
applying the reference voltage to the first coupling component of the first half-cell comparator;
applying, during the second time period, the input voltage to the first coupling component of the second half-cell comparator;

during a third time period:
coupling the output of the second amplification stage of the first half-cell comparator to the input of the second amplification stage of the second half-cell comparator;
coupling the output of the second amplification stage of the second half-cell comparator to the input of the second amplification stage of the first half-cell comparator;
receiving, at a control circuit, complementary half-cell outputs from the first and second half-cell comparators, wherein one output is substantially equal to a maximum supply voltage and wherein the complementary output is substantially equal to a minimum supply voltage;
outputting from the control circuit a maximum and a minimum control voltage, wherein the maximum and the minimum control voltage are substantially the same regardless of which half-cell comparator output is substantially equal to the maximum supply voltage and regardless of which half-cell comparator output is substantially equal to the minimum supply voltage;
receiving the maximum and minimum control voltages at the first amplification stage of each half-cell comparator; and
disabling the first amplification stage of each half-cell comparator in response to the control voltages, wherein disabling the first amplification stages reduces power consumption; and coupling a bias voltage to the output of the first amplification stage of each half-cell comparator.

18. A voltage measuring circuit comprising a first half-cell comparator and a second half-cell comparator, wherein each half-cell comparator comprises:

a first amplification stage;

at least one first coupling component for coupling voltage to the input of the first amplification stage;

a first pair of complementary clocked analog switches for applying either a reference voltage or an input voltage to the at least one first coupling component;

a second amplification stage;

at least one second coupling component for coupling an output of the first amplification stage to an input of the second amplification stage; and a cross-coupling clocked analog switch for connecting an output of the second amplification stage of a half-cell to the input of the second amplification stage of the other half-cell;

wherein the first pair of complementary clocked analog switches are connected so that when the input voltage is applied to the first half-cell, the reference voltage is applied to the second half-cell, and when the reference voltage is applied to the first half-cell, the input voltage is applied to the second half-cell;

wherein the first amplification stage of the first and second half-cells generate a first output voltage and a complementary second output voltage, respectively; and wherein the cross-coupling clocked analog switches latch the outputs of each second amplifier stage.

19. The voltage measuring circuit of claim 18, wherein each half-cell comparator further comprises:

a first auto-zero clocked analog switch for coupling the output of the first amplifier stage to the input of the first amplifier stage; and a second auto-zero clocked analog switch for coupling the output of the second amplifier stage to the input of the second amplifier stage.

20. The voltage measuring circuit of claim 18, wherein the first pair of clocked complementary analog switches are driven by a first clock signal and its complement, and wherein the cross-coupling clocked analog switches are driven by a second clock signal.

21. The voltage measuring circuit of claim 20, wherein each half-cell comparator further comprises:

a first auto-zero clocked analog switch for coupling the output of the first amplifier stage to the input of the first amplifier stage; and a second auto-zero clocked analog switch for coupling the output of the second amplifier stage to the input of the second amplifier stage;

wherein the first and second auto-zero clocked analog switches are driven by the first clock signal.

22. The voltage measuring circuit of claim 18, further comprising: a control circuit comprising:

a first control circuit input coupled to the output of the second amplifier stage of the first half-cell comparator;

a second control circuit input coupled to the output of the second amplifier stage of the second half-cell comparator;

a first control circuit output driven alternately by either the output of the second amplifier stage of the first half-cell comparator or the second half-cell comparator, whichever has the lower voltage; and a second control circuit output driven alternately by either the output of the second amplifier stage of the first half-cell comparator or the second half-cell comparator, whichever has the higher voltage;

wherein the first control circuit output is at a minimum voltage when the outputs of each second amplifier stage are latched, and wherein the second control circuit output is at a maximum voltage when the outputs of each second amplifier stage are latched.

23. The voltage measuring circuit of claim 18, further comprising:

a clocked bias circuit having one or more clock inputs and having at least one output, the at least one bias circuit output connectable to the output of each half-cell first amplifier stage output, the at least one bias circuit output also comprising a noise discharge path; and a pair of clocked bias-control analog switches that selectively couple the at least one bias circuit output to the first amplifier stage output of each half-cell.

24. The voltage measuring circuit of claim 23, wherein the bias circuit output is a voltage of approximately half the supply voltage when the clock inputs are active.

25. The voltage measuring circuit of claim 24, wherein the bias circuit is disabled when the clock inputs are inactive.

26. The voltage measuring circuit of claim 23, wherein the pair of clocked bias-control analog switches further selectively couple each half-cell first amplifier stage output to the noise discharge path of the at least one bias circuit output.

27. The voltage measuring circuit of claim 22, further comprising:

a clocked bias circuit having one or more clock inputs and having at least one output, the at least one bias circuit output connectable to the output of each half-cell first amplifier stage output, the at least one bias circuit output also having a noise discharge path; and a pair of clocked bias-control analog switches that selectively apply the at least one bias circuit output to the first amplifier stage output of each half-cell.

28. The voltage measuring circuit of claim 27, wherein the bias circuit output is a voltage of approximately half the supply voltage when the clock inputs are active.

29. The voltage measuring circuit of claim 27, wherein;

the first pair of clocked complementary analog switches are driven by a first clock signal and its complement;

the cross-coupling clocked analog switches are driven by a second clock signal;

the one or more clock inputs of the clocked bias circuit is driven by the second clock signal or its complement; and the pair of clocked bias-control analog switches are driven by the second clock signal.

* * * * *